United States Patent
Choi

(10) Patent No.: US 9,455,008 B2
(45) Date of Patent: Sep. 27, 2016

(54) WORD LINE TEST CONTROL CIRCUIT OF SEMICONDUCTOR APPARATUS AND TESTING METHOD THEREOF

(71) Applicant: SK hynix Inc., Icheon-si, Gyeonggi-do (KR)

(72) Inventor: Don Hyun Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/278,432

(22) Filed: May 15, 2014

(65) Prior Publication Data

US 2015/0235687 A1  Aug. 20, 2015

(30) Foreign Application Priority Data

Feb. 19, 2014 (KR) .................. 10-2014-0018870

(51) Int. Cl.
| | |
|---|---|
| *G11C 8/08* | (2006.01) |
| *G11C 8/12* | (2006.01) |
| *G11C 29/06* | (2006.01) |
| *G11C 29/26* | (2006.01) |
| *G11C 29/12* | (2006.01) |

(52) U.S. Cl.
CPC .................. *G11C 8/12* (2013.01); *G11C 29/06* (2013.01); *G11C 29/26* (2013.01); *G11C 8/08* (2013.01); *G11C 2029/1202* (2013.01); *G11C 2029/2602* (2013.01)

(58) Field of Classification Search
CPC . G11C 8/12; G11C 2029/2602; G11C 29/08; G11C 29/12; G11C 29/00; G11C 29/50
See application file for complete search history.

(56) References Cited

U.S. PATENT DOCUMENTS

| | | | | |
|---|---|---|---|---|
| 5,241,500 A | * | 8/1993 | Barth, Jr. .................. | G11C 7/20 365/189.16 |
| 5,956,279 A | * | 9/1999 | Mo ........................ | G11C 29/34 365/185.09 |
| 5,963,492 A | * | 10/1999 | Hsu .......................... | G11C 8/00 365/200 |
| 6,038,183 A | * | 3/2000 | Tsukude ................... | G11C 5/00 365/201 |
| 6,141,278 A | * | 10/2000 | Nagase ..................... | G11C 8/04 365/222 |
| 6,437,590 B1 | * | 8/2002 | Tatsumi ........... | G01B 31/31850 324/750.05 |
| 6,502,214 B1 | * | 12/2002 | Pyeon .......................... | 714/718 |
| 6,507,532 B1 | * | 1/2003 | Fujino ..................... | G11C 8/12 365/230.03 |

(Continued)

FOREIGN PATENT DOCUMENTS

KR 20070077982 A * 7/2007
KR 1020120069111 A 6/2012

*Primary Examiner* — Huan Hoang
*Assistant Examiner* — Roberto Mancera
(74) *Attorney, Agent, or Firm* — William Park & Associates Ltd.

(57) ABSTRACT

A semiconductor apparatus includes a plurality of memory blocks divided into an even mat group and an odd mat group; and an active control block configured to activate any one group of the even mat group and the odd mat group at a first timing in response to a plurality of test signals, and activate the other group at a second timing.

10 Claims, 5 Drawing Sheets

(56) References Cited

U.S. PATENT DOCUMENTS

| | | | |
|---|---|---|---|
| 6,551,846 B1 * | 4/2003 | Furutani | H01L 22/34 257/48 |
| 6,741,509 B2 * | 5/2004 | Kato | G11C 29/26 365/200 |
| 6,741,510 B2 * | 5/2004 | Ohbayashi | G11C 29/18 365/201 |
| 6,781,889 B2 * | 8/2004 | Kliewer | G11C 29/26 365/189.09 |
| 6,829,193 B2 * | 12/2004 | Ishizuka | G11C 8/12 365/201 |
| 6,967,880 B2 * | 11/2005 | Park | H01L 27/105 257/E27.081 |
| 7,099,224 B2 * | 8/2006 | Chou | G11C 29/006 365/185.22 |
| 7,327,610 B2 * | 2/2008 | Choi | G11C 11/4094 365/185.25 |
| 7,411,809 B2 * | 8/2008 | Ogiwara | G11C 11/22 365/145 |
| 8,116,114 B2 * | 2/2012 | Kobayashi et al. | 365/63 |
| 8,274,853 B2 * | 9/2012 | Lee | G11C 29/12005 365/201 |
| 8,526,241 B2 * | 9/2013 | Shirakawa | G11C 16/0483 365/185.11 |
| 8,780,617 B2 * | 7/2014 | Kang | G11O 5/06 365/158 |
| 8,804,444 B2 * | 8/2014 | Cho | G11C 29/06 365/189.05 |
| 9,053,821 B2 * | 6/2015 | Riho | G11C 29/06 |
| 9,251,912 B2 * | 2/2016 | Lee | G11C 29/006 |
| 2001/0024384 A1 * | 9/2001 | Arimoto et al. | 365/200 |
| 2003/0161204 A1 * | 8/2003 | Ohbayashi et al. | 365/201 |
| 2006/0056252 A1 * | 3/2006 | Park et al. | 365/205 |

\* cited by examiner

WORD LINE TEST CONTROL CIRCUIT OF SEMICONDUCTOR APPARATUS AND TESTING METHOD THEREOF

CROSS-REFERENCES TO RELATED APPLICATION

The present application claims priority under 35 U.S.C. §119(a) to Korean application number 10-2014-0018870, filed on Feb. 19, 2014, in the Korean Intellectual Property Office, which is incorporated herein by reference in its entirety.

BACKGROUND

1. Technical Field

Various embodiments relate to a semiconductor apparatus, and more particularly, to a semiconductor apparatus and a testing method thereof.

2. Related Art

A semiconductor apparatus requires various test operations.

As one of test operations, a wafer burn-in test is performed.

SUMMARY

In an embodiment, a semiconductor apparatus may include a plurality of memory blocks divided into an even mat group and an odd mat group. The semiconductor apparatus may also include an active control block configured to activate any one group of the even mat group and the odd mat group at a first timing in response to a plurality of test signals, and activate the other group at a second timing.

In an embodiment, a semiconductor apparatus may include a memory block configured to be divided into an even mat group and an odd mat group. The semiconductor apparatus may also include an active control block configured to activate a unit memory block select signal in response to a first test signal. In addition, the semiconductor apparatus includes a word line control block configured to activate a part of a plurality of word lines of any one of the even mat group and the odd mat group, in response to the activated unit memory block select signal, address signals and a second test signal. Further, the active control block is configured to deactivate the unit memory block select signal in response to a third test signal.

In an embodiment, there may be provided a testing method comprising dividing an apparatus into a word line activation period and a burn-in test period. Any one of an even-numbered unit memory group and an odd-numbered unit memory group among a plurality of memory blocks is activated during the word line activation period, and an other is activated after a predetermined time.

DETAILED DESCRIPTION

A semiconductor apparatus and a testing method according to the invention will be described below with reference to the accompanying figures through various embodiments. The wafer burn-in test is a test for applying a stress (for example, applying a voltage for a lengthy period) between adjacent memory cells of a memory block (for example, a memory bank) of a semiconductor apparatus. In order to perform the burn-in test, it is necessary to perform an operation of simultaneously activating even-numbered word lines (hereinafter, referred to as 'even word lines') among the word lines (for example, sub word lines SWL0, SWL1, . . . ) of all memory blocks. Moreover, since the even word lines of all the memory blocks are simultaneously activated, a power supply voltage VBBW for precharging odd-numbered word lines (hereinafter, referred to as 'odd word lines') is likely to rise over the threshold voltage of transistors which constitute memory cells Vt (Cell TR). The rise of the power supply voltage VBBW may be due to noise generated attributable to a power supply voltage VPP for activating the even word lines. Consequently, as even the odd word lines are activated in an unwanted manner, a problem may be caused in that it is difficult to precisely perform a test. In addition, as the degree of integration of a semiconductor apparatus increases, that is, as the number of word lines of memory blocks which should be simultaneously activated increases, the problem caused due to noise may become serious, and the reliability of a test may be degraded. A semiconductor apparatus capable of enabling a stable test without increasing a test time and a testing method thereof is described herein.

Figure 1:
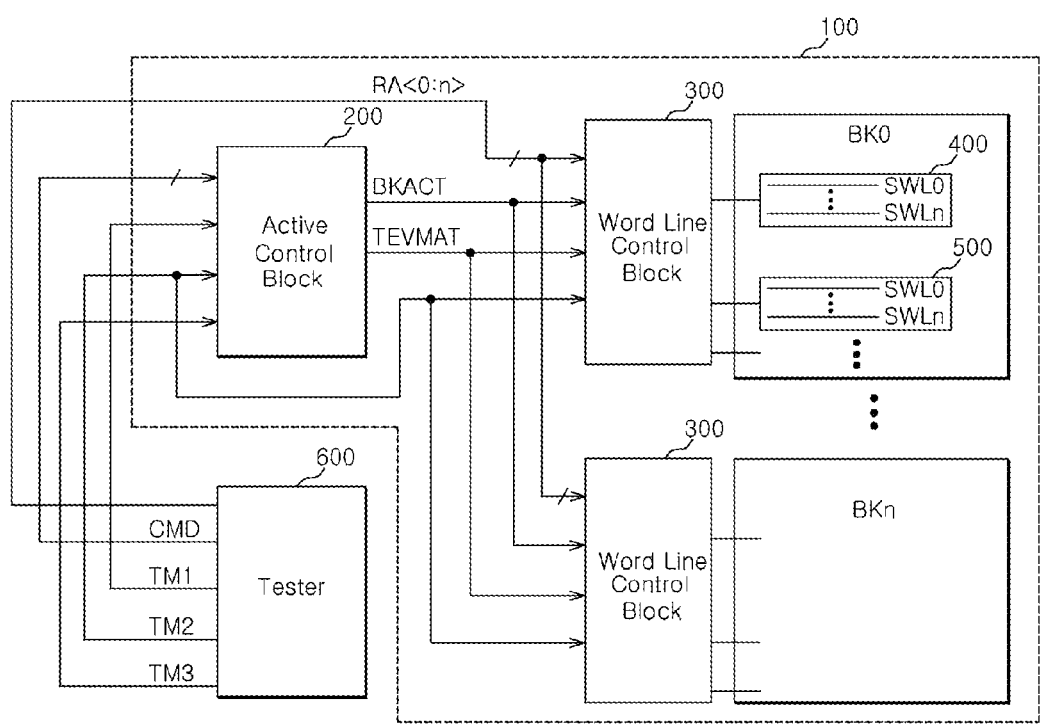
FIG. 1 is a block diagram showing a semiconductor apparatus in accordance with an embodiment of the invention.

Referring to FIG. 1, a semiconductor apparatus 100 in accordance with an embodiment of the invention may include an active control block 200, a plurality of word line control blocks 300, and a plurality of memory blocks. A plurality of memory blocks may be, for example, BK0 to BKn.

Each of the plurality of memory blocks BK0 to BKn may include a plurality of mats. The plurality of mats may be divided into an even mat group and an odd mat group. The even mat group comprises even numbered mats 400 of the plurality of mats, and the odd mat group comprises odd numbered mats 500 of the plurality of mats.

In each of the plurality of mats, a plurality of word lines, such as a plurality of sub word lines SWL0 to SWLn may be disposed.

The active control block 200 may be configured to generate a control signal to block the selection of specified mats. More specifically, the odd mat group 500, in each of the plurality of memory blocks BK0 to BKn, that is, a unit memory block select signal TEVMAT, in response to a first test signal TM1.

The active control block 200 may be configured to generate a bank active signal BKACT according to a second test signal TM2.

The active control block 200 may be configured to deactivate the unit memory block select signal TEVMAT according to a third test signal TM3.

The active control block 200 may be configured to generate the bank active signal BKACT according to the third test signal TM3.

The active control block 200 may be configured to generate the bank active signal BKACT according to a command CMD.

The word line control block 300 may be configured to activate the word lines of any one of the even mat group 400 and the odd mat group 500. Moreover, the word lines may be activated in response to the unit memory block select signal TEVMAT, the bank active signal BKACT and address signals RA<0:N>, (for example), row address signals.

The word line control block 300 may be configured to activate a part, for example, of even word lines SWL0, SWL2, ..., of the plurality of word lines SWL0 to SWLn of a mat group that is selected between the even mat group 400 and the odd mat group 500. The activation may be in response to the second test signal TM2, the bank active signal BKACT and the address signals RA<0:N>.

The word line control block 300 may include an address decoder therein.

The word line control block 300 may select any one of the even mat group 400, between the even mat group 400 and the odd mat group 500, according to a first signal bit (for example, a signal bit RA<M>) among the address signals RA<0:N>. The word line control block 300 may select any one of the even mat group 400 when the unit memory block select signal TEVMAT is activated.

The first signal bit RA<M> is an address signal bit capable of distinguishing the even mat group 400 and the odd mat group 500 in each of the plurality of memory blocks BK0 to BKn.

Accordingly, the word line control block 300 may disregard the remaining signal bits excluding the first signal bit RA<M>. In addition, the word line control block 300 may select the even mat group 400 or the odd mat group 500 according to the logic level of the first signal bit RA<M>.

The word line control block 300 may select a part of even word lines SWL0, SWL2, ..., of the plurality of word lines SWL0 to SWLn, according to a second signal bit (for example, the least significant signal bit RA<0>) among the address signals RA<0:N>. Moreover, the word line control block 300 may select a part of the even word lines SWL0, SWL2, ..., when the second test signal TM2 is activated.

The second signal bit RA<0> is an address signal bit capable of distinguishing even word lines SWL0, SWL2, ... from odd word lines SWL1, SWL3, ....

Accordingly, the word line control block 300 may disregard the remaining signal bits excluding the second signal bit RA<0>. Further, the word line control block 300 may select the even word lines SWL0, SWL2, ... or the odd word lines SWL1, SWL3, ... according to the logic level of the second signal bit RA<0>.

The word line control block 300 may select specified word lines of a specified mat group by only determining the logic levels of the first and second signal bits RA<M,0> among the address signals RA<0:N> during the activation period of the unit memory block select signal TEVMAT and the second test signal TM2. In addition, the word line control block 300 may activate the selected word lines according to the bank active signal BKACT.

When the unit memory block select signal TEVMAT is deactivated and the second test signal TM2 is activated, the word line control block 300 may select even word lines SWL0, SWL2, ... or odd word lines SWL1, SWL3, ... among the word lines of the even mat group 400 and the odd mat group 500. Moreover, the word line control block 300 may select the even word lines SWL0, SWL2, ... by determining the logic level of only the second signal bit RA<0> among the address signals RA<0:N>.

The command CMD and the first to third test signals TM1 to TM3 may be provided through an external system. An external system may be, for example, a tester 600.

Figure 2:
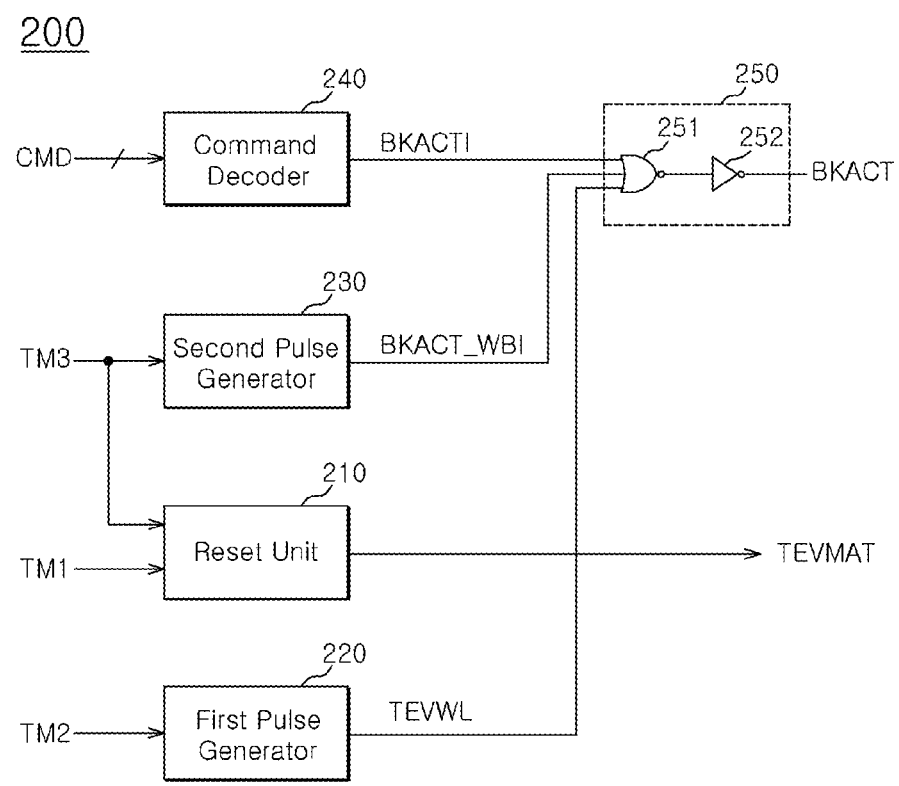
FIG. 2 is a block diagram showing the internal configuration of the active control block shown in FIG. 1.

Referring to FIG. 2, the active control block 200 may include a reset unit 210, a first pulse generator 220, a second pulse generator 230, a command decoder 240, and a signal combination unit 250.

The reset unit 210 may be configured to output the first test signal TM1 as the unit memory block select signal TEVMAT, and reset, or more specifically, deactivate, the unit memory block select signal TEVMAT according to the third test signal TM3.

The first pulse generator 220 may be configured to generate a first pulse signal TEVWL according to the second test signal TM2.

The second pulse generator 230 may be configured to generate a second pulse signal BKACT_WBI according to the third test signal TM3.

The command decoder 240 may be configured to generate a third pulse signal BKACTI according to the command CMD.

The command CMD may become a combination of two or more from among a RAS (row address strobe) signal, a CAS (column address strobe) signal and a WE (write enable) signal.

The signal combination unit 250 may be configured to OR or combine the first to third pulse signals TEVWL, BKACT_WBI and BKACTI. The signal combination unit 250 may also output the bank active signal BKACT.

The signal combination unit 250 may include a NOR gate 251 along with an inverter 252.

A testing method of the semiconductor apparatus in accordance with an embodiment of the invention, configured as mentioned above, will be described below with reference to FIGS. 4 and 5.

A wafer burn-in test is a test to apply a stress (for example, a voltage) between adjacent memory cells of memory blocks of a semiconductor apparatus.

In order for the burn-in test to occur, it is necessary to perform an operation of activating word lines of memory blocks.

In a normal operation, the third pulse signal BKACTI is generated according to the command CMD, and accordingly, the bank active signal BKACT is generated (see FIG. 2).

As a result, a specified word line of a memory block corresponding to the address signals RA<0:N> provided from an exterior may be activated.

Figure 3:
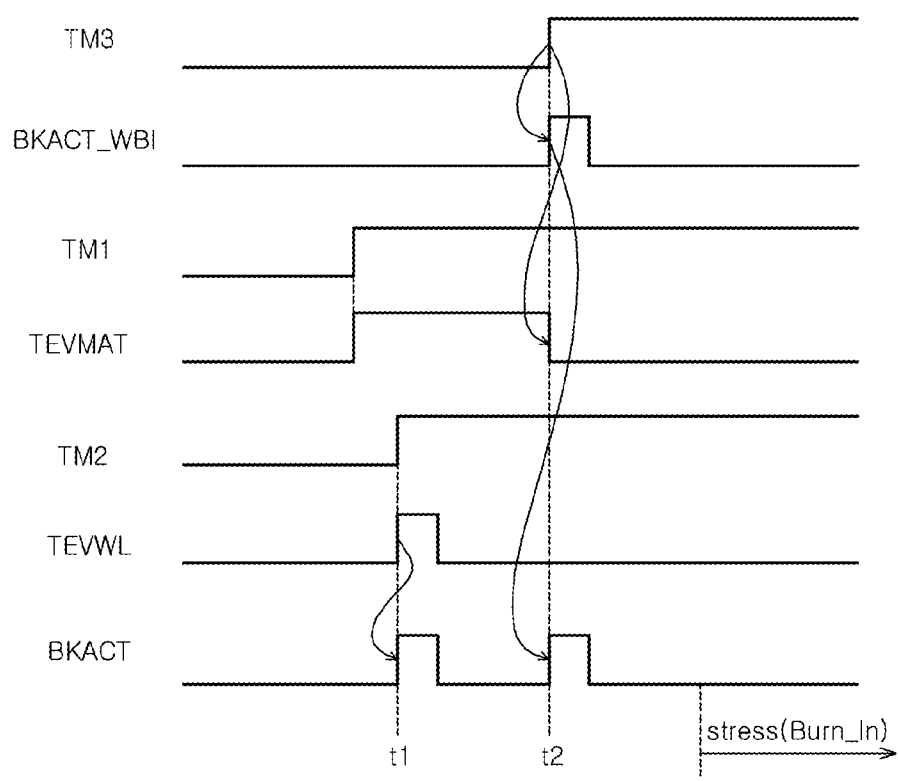
FIG. 3 is a timing diagram explaining a test operation in accordance with an embodiment of the invention.

Referring to FIG. 3, in a test operation, for example, a burn-in test, the first to third test signals TM1 to TM3 may be provided to the semiconductor apparatus 100 from the exterior of the semiconductor apparatus 100. The exterior of the semiconductor apparatus 100 may be, for example, the tester 600.

The address signals RA<0:N> may be provided from the exterior before the first test signal TM1 or the second test signal TM2 is activated.

For example, it may be assumed that the first signal bit RA<M> and the second signal bit RA<0> of the address signals RA<0:N> are provided as logic low levels to select the even mat group 400 and even word lines.

The first test signal TM1 is a signal to block the selection of a specified mat group in each of the plurality of memory blocks BK0 to BKn.

The unit memory block select signal TEVMAT is activated according to the activation of the first test signal TM1.

The second test signal TM2 is activated at a first timing t1 when a predetermined time has passed and after the unit memory block select signal TEVMAT is activated.

The second test signal TM2 may select any one of the even word lines SWL0, SWL2, . . . and the odd word lines SWL1, SWL3, . . . of a mat group selected between the even mat group 400 and the odd mat group 500 in each of the plurality of memory blocks BK0 to BKn.

Since the unit memory block select signal TEVMAT and the second test signal TM2 are in the activated states, the word line control block 300 disregards the remaining signal bits excluding the first signal bit RA<M> and the second signal bit RA<0> among the address signals RA<0:N>. Further, the word line control block 300 selects any one of the even mat group 400 and the odd mat group 500 by determining the logic levels of the first signal bit RA<M> and the second signal bit RA<0>.

Since the first signal bit RA<M> and the second signal bit RA<0> of the address signals RA<0:N> have the logic low levels to respectively select the even mat group 400 and even word lines, the word line control block 300 then consequently selects the even word lines SWL0, SWL2, . . . of the even mat group 400.

The first pulse signal TEVWL is generated at a time when the second test signal TM2 is activated.

The bank active signal BKACT is generated as a result of the first pulse signal TEVWL.

The even word lines SWL0, SWL2, . . . of the even mat group 400 in each of the plurality of memory blocks BK0 to BKn are activated as a result of the bank active signal BKACT.

The third test signal TM3 is activated at a second timing t2 when a predetermined time has then passed from the first timing t1.

The third test signal TM3 is a signal to reset, or, deactivate, the unit memory block select signal TEVMAT.

In an embodiment of the invention, it is intended that the number of word lines to be simultaneously activated is decreased without increasing a test time.

Therefore, because only the even mat group 400 is activated at the first timing t1 and the odd mat group 500 is retained in a deactivated state, the unit memory block select signal TEVMAT can be reset by activating the third test signal TM3 at the second timing t2.

Since the unit memory block select signal TEVMAT is deactivated and only the second test signal TM2 is in the activated state, the word line control block 300 may disregard the remaining signal bits excluding the second signal bit RA<0> of the address signals RA<0:N>. Further, the word line control block may determine the logic level of the second signal bit RA<0>.

Since the second signal bit RA<0> of the address signals RA<0:N> has the logic low level, the word line control block 300 may as a result additionally select the even word lines SWL0, SWL2, . . . of the odd mat group 500 in the state in which the even word lines SWL0, SWL2, . . . of the even mat group 400 are selected.

The second pulse signal BKACT_WBI is generated when the third test signal TM3 is activated.

The bank active signal BKACT is generated when the second pulse signal BKACT_WBI is generated.

According to the bank active signal BKACT, the even word lines SWL0, SWL2, . . . of both the even mat group 400 and odd mat group 500 in each of the plurality of memory blocks BK0 to BKn are activated.

Through the above-described procedure, one half number of word lines are sequentially activated after the second timing t2, and then, after an additional preparation time has passed, a stress may be applied to the activated word lines. More specifically, a burn-in test may be performed by the tester 600.

In an entire test procedure, a word line activation period, or a time to the second timing t2, is nothing but only a part of an entire test time.

A time required for activation of word lines, or a time to the second timing t2, is a time that is substantially relatively short when compared to a burn-in test period.

For instance, while a time required to activate word lines is a micro second unit, a burn-in test period approaches several tens of seconds.

Figure 4:
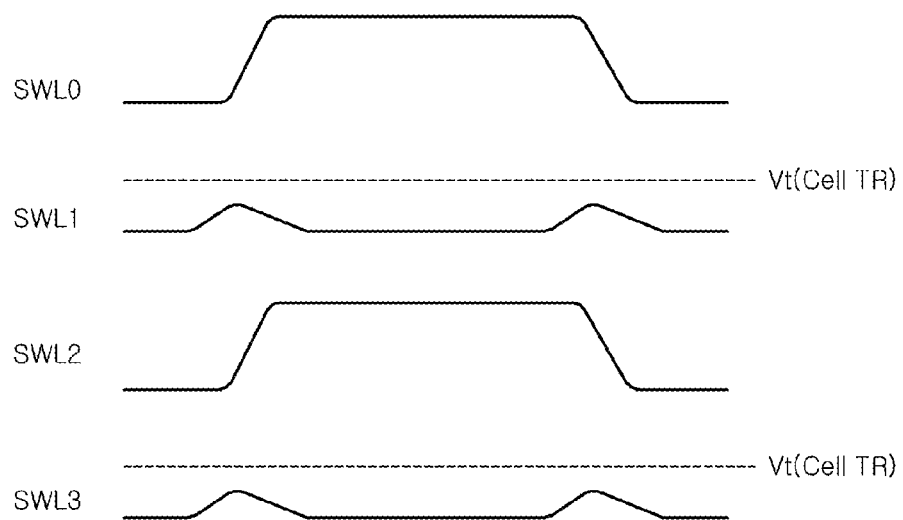
FIG. 4 is a waveform diagram showing variation in the voltages of word lines during a test procedure in accordance with an embodiment of the invention.

Hence, in an embodiment of the invention, by decreasing the number of word lines to be simultaneously activated, as may be seen from FIG. 4, it is possible to prevent a power supply voltage (VBBW) to precharge specifically-numbered word lines, from rising over the threshold voltage of transistors which constitute memory cells, as a result of noise between adjacent word lines.

Moreover, because the relatively short time required to activate word lines is divided, and any one of the even mat group 400 and the odd mat group 500 is activated and then the other is additionally activated, an increase in an entire test time is thus negligibly insignificant.

In the above-described embodiment of the invention, the scheme of dividing the plurality of mats of each of the plurality of memory blocks BK0 to BKn and then activating the even word lines of a selected mat group represents only an embodiment. Moreover, it is possible to divide by 4 or 8 the plurality of mats of each of the plurality of memory blocks BK0 to BKn by using test signals and row address signals and then activate word lines one part by one part.

Figure 5:
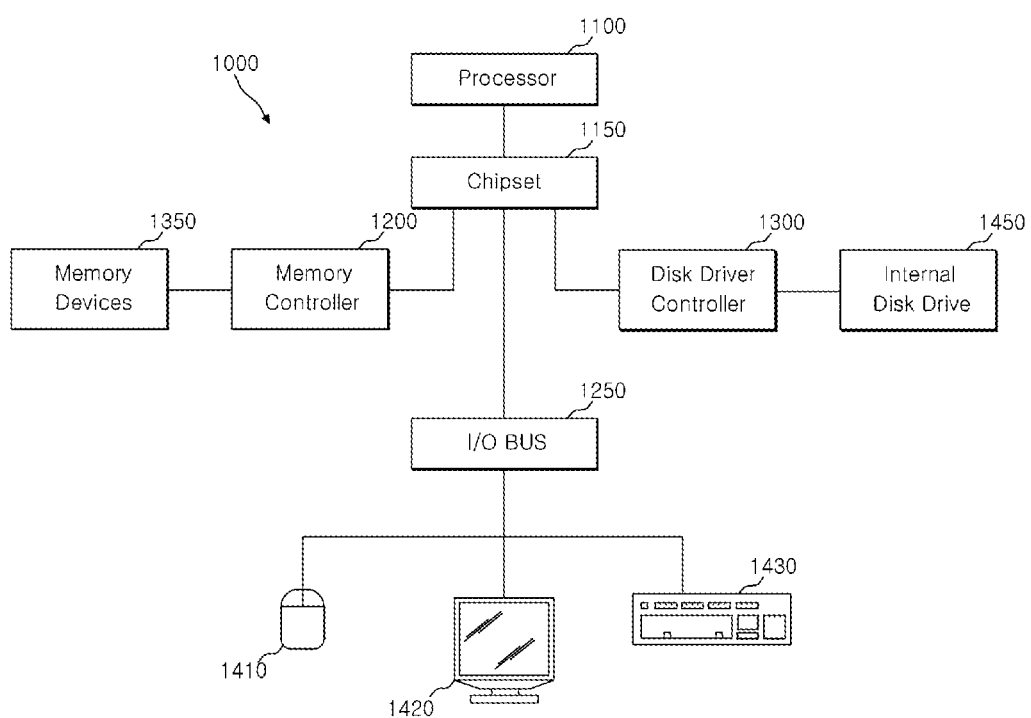
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller can receive a request provided from the processor 1100 through the chipset 1150. The memory controller 1200 may be electrically coupled to one or more memory devices 1350. The memory device 1350 may include the semiconductor apparatus 100 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 110 and one or more internal disk drives 1450. The disk drive controller 1300 and the internal disk drive 1450 may communicate with each other or with the chipset 1150 using virtually any type of communication protocol.

As is apparent from the above descriptions, according to an embodiment of the invention, it is possible to stably test a semiconductor apparatus.

While certain embodiments have been described above, it will be understood to those skilled in the art that the embodiments described are by way of example only. Therefore, the semiconductor apparatus and the testing method thereof described herein should not be limited based on the described embodiments. Rather, the semiconductor apparatus and the testing method described herein should only be limited in light of the claims that follow when taken in conjunction with the above description and accompanying figures.

What is claimed is:

1. A semiconductor apparatus comprising:
a plurality of memory blocks each including a plurality of mats, wherein the plurality of mats are divided into an even mat group and an odd mat group, the even mat group comprises even numbered mats of the plurality of mats, and the odd mat group comprises odd numbered mats of the plurality of mats; and
an active control block configured to activate even-numbered word lines of the even mat group of each of the plurality of memory blocks at a first timing during a word line activation period in response to a plurality of test signals, and activate even-numbered word lines of the odd mat group of each of the plurality of memory blocks at a second timing during the word line activation period,
wherein a burn-in test period occurs after the word line activation period.

2. The semiconductor apparatus according to claim 1, wherein the active control block is configured to activate the even-numbered word lines of the odd mat group at the second timing while maintaining an activating state of the even-numbered word lines of the even mat group.

3. The semiconductor apparatus according to claim 1, wherein the active control block is configured to generate a bank active signal and a unit memory block select signal in response to the plurality of test signals.

4. The semiconductor apparatus according to claim 3, wherein the active control block comprises:
a reset unit configured to output a first test signal as the unit memory block select signal, and reset the unit memory block select signal in response to a third test signal;
a first pulse generator configured to generate a first pulse signal in response to a second test signal;
a second pulse generator configured to generate a second pulse signal in response to the third test signal; and
a signal combination unit configured to combine the first pulse signal and the second pulse signal, and output the bank active signal.

5. The semiconductor apparatus according to claim 3, further comprising:
a word line control block configured to activate any one group or both groups of the even mat group and the odd mat group of any one of the plurality of memory blocks, in response to address signals and the unit memory block select signal.

6. The semiconductor apparatus according to claim 5, wherein the word line control block is configured to activate the any one group in response to a first signal bit of the address signals and the unit memory block select signal.

7. The semiconductor apparatus according to claim 6, wherein the word line control block is configured to activate a part of a plurality of word lines of a group selected between the even mat group and the odd mat group, in response to a second signal bit of the address signals and any one of the plurality of test signals.

8. The semiconductor apparatus according to claim 1, further comprising:
a tester configured to provide the plurality of test signals to the active control block.

9. The semiconductor apparatus according to claim 8, wherein the tester is configured to perform, after word lines selected among the even mat group or the odd mat group are activated, a burn-in test for the activated word lines.

10. A testing method of a semiconductor apparatus comprising:
wherein the testing method is performed during a test period comprising both a word line activation period and a burn-in test period,
activating even-numbered word lines of an even mat group of a memory block at a first timing during the word line activation period, and activating even-numbered word lines of an odd mat group of the memory block at a second timing during the word line activation period; and
performing a burn-in test to the activated even-numbered word lines of the even mat group and of the odd mat group during the burn-in test period.

* * * * *